United States Patent
Morin et al.

(10) Patent No.: US 8,768,277 B1
(45) Date of Patent: Jul. 1, 2014

(54) AUTOMATIC GAIN CONTROL OF A RECEIVER CIRCUIT

(71) Applicant: EM Microelectronic-Marin S.A., Marin (CH)

(72) Inventors: Marc Morin, Colorado Springs, CO (US); Tindaro Pittorino, Buchs (CH)

(73) Assignee: EM Microelectronics-Marin S.A., Marin (CH)

( * ) Notice: Subject to any disclaimer, the term of this patent is extended or adjusted under 35 U.S.C. 154(b) by 0 days.

(21) Appl. No.: 13/720,279

(22) Filed: Dec. 19, 2012

(51) Int. Cl.
*H04B 1/06* (2006.01)

(52) U.S. Cl.
USPC ............... 455/234.1; 455/226.1; 455/324; 455/574

(58) Field of Classification Search
USPC ...................................... 455/234.1
See application file for complete search history.

(56) References Cited

U.S. PATENT DOCUMENTS

| | | | |
|---|---|---|---|
| 6,253,092 B1 * | 6/2001 | Nguyen et al. | 455/522 |
| 6,839,387 B1 * | 1/2005 | Mittel | 375/247 |
| 7,991,087 B2 * | 8/2011 | Solum | 375/345 |
| 2003/0035097 A1 * | 2/2003 | Lai et al. | 356/5.01 |
| 2003/0139166 A1 * | 7/2003 | Vilhonen et al. | 455/324 |
| 2003/0232608 A1 * | 12/2003 | Yamauchi | 455/136 |

* cited by examiner

*Primary Examiner* — Ajibola Akinyemi
(74) *Attorney, Agent, or Firm* — Oblon, Spivak, McClelland, Maier & Neustadt, L.L.P.

(57) ABSTRACT

The present invention relates to a receiver circuit for processing of electrical signals, and comprising:
- an antenna (12),
- at least one amplifier (14) coupled to the output of the antenna (12),
- an automatic gain control circuit (30) coupled to the at least one amplifier (14) to modify a gain thereof, and
- at least one voltage offset-compensating circuit (50) embedded in the automatic gain control circuit (30) and comprising a clock generator (40) and at least one capacitor (42, 44) to effectively compensate an offset voltage.

11 Claims, 1 Drawing Sheet

AUTOMATIC GAIN CONTROL OF A RECEIVER CIRCUIT

FIELD OF THE INVENTION

The present invention relates to the field of receiver circuits and in particular to RF receiver circuits featuring an automatic gain control (AGC). Moreover, the invention relates to optimization of automatic gain control circuits in RF receiver assemblies for reducing power consumption, and improving sensitivity and linearity of such receiver circuits.

BACKGROUND OF THE INVENTION

Analogue circuits in an RF receiver exhibit comparatively high power consumption in order to provide a good linearity regarding signals of high input power as well as good sensitivity regarding signals of low input power.

Linearity of an amplifier refers to the consistent transfer function of an amplifier for small or large signals. Measures of degradation of linearity are for instance signal compression or inter-modulation/distortion of large input signals. Inter-modulation/distortion refers to the amplitude modulation of signals containing two or more different frequencies in a system. The inter-modulation between each frequency component will form additional signals at frequencies that are not just at harmonic frequencies of either but also at the sum and difference frequencies of the original frequencies and multiples of those sum and difference frequencies. Inter-modulation is rarely desirable in radio processing. For radio reception, strong adjacent channels can interfere with the desired signal resulting in loss of reception.

Sensitivity of an RF receiver circuit may be strongly correlated to the signal-to-noise ratio (SNR) caused by components in a radio frequency signal chain. Measures of degradation of the SNR are for instance noise figure (NF) or noise factor (F).

In order to provide good linearity to large input power signal levels and good sensitivity to low input power signals, analogue circuits in radio receivers exhibit a comparatively high current consumption. For mobile application scenarios this may lead to unacceptably short battery life. Reducing the current consumption of the RF receiver circuit either degrades sensitivity, linearity, or both.

Moreover, if the gain of a receiver is not properly adjusted for incoming signal strength of a desired signal, the receiver may be improperly insensitive or overly sensitive. An insensitive receiver is likely to be a poor receiver of a low level desired signal. An overly sensitive receiver is more susceptible to nearby interferers.

There already exist automatic gain control (AGC) circuits that are operable to decrease the gain of the receiver on demand. Hence, in the presence of a comparatively large input signal comparatively good linearity specifications can be achieved, while increasing gain when a comparatively small input signal or no further signals are present.

A conventional automatic gain control is for instance described in U.S. Pat. No. 7,664,211 B2.

Generally, an RF receiver featuring AGC typically comprises a low-noise amplifier (LNA), a down-converter mixer, a low-pass or band-pass filter, an analogue-to-digital converter (ADC) and a demodulator. The AGC circuit itself typically comprises a peak detector by means of which sensing of a received RF signal can be conducted. The received or detected RF signal is then to be compared with a threshold value provided by a threshold value generator, typically implemented in form of a digital-to-analogue converter (DAC).

Comparison of the signals of the peak detector and the threshold value generator is typically conducted by means of a comparator of an AGC circuit. The output of the comparator is then coupled with an up/down counter whose output is fed back to the LNA in order to adjust the gain of the LNA in discrete steps.

If for instance the RF input power is comparatively large, the comparator causes the up/down counter to count up, thereby decreasing the gain of the LNA. In this way, the linearity of the receiver can be increased allowing reception of a desired signal in the presence of blocking signals. In another scenario, wherein the RF input power is small, the up/down counter counts down, thus increasing the gain of the LNA. This increases sensitivity of the receiver allowing to receive comparatively small or weak signals, e.g. broadcasted by a source which is located far away.

Typically, separate thresholds are implemented to create a window for counting up and for counting down. Such a window can be in principle implemented by means of two separate threshold value generators with two comparators. Alternatively, two different thresholds could also be implemented by operating the comparator and the threshold value generator in difficult threshold modes in a temporal alternating way, hence by driving the threshold value generator and the respective comparator in separate comparison cycles.

Even though existing AGC designs allow for a substantive reduction of power consumption a problem may be encountered when the LNA is in a low-gain state and when an RF signal of comparatively high power is abruptly no longer available. Then, a comparatively small threshold voltage needs to be used on the threshold value generator to trigger the up/down counter to count back down. Here, generic offsets in the peak detector, the threshold value generator, hence in the DAC and in the comparator itself may become significant compared to the small threshold voltage. In a critical situation, the counter will not be triggered to count down in order to raise sensitivity of the RF receiver.

SUMMARY OF THE INVENTION

It is therefore an object of the present invention to provide an improved receiver circuit implemented with a more robust automatic gain control, wherein generic and inevitable offset signals of components of the AGC are no longer suitable to affect the operation of the automatic gain control and the respective receiver circuit. In this way, the power consumption of the receiver can be reduced. It is a further aim of the invention to provide a receiver circuit which is particularly insensitive to inevitable variations that may be due to a manufacturing process. In this way, the invention further aims to make use of low-priced electronic components for a receiver circuit without degrading input power sensitivity and linearity thereof. In this way, the invention aims to reduce production costs.

In a first aspect, a receiver circuit, in particular an RF receiver circuit is provided, which is particularly operable to process electrical signals. The receiver circuit comprises an antenna in order to receive electrical signals, in particular electromagnetic radiation of a predefined spectrum. The receiver further comprises at least one amplifier coupled to the output of the antenna. The amplifier is preferably implemented as a low-noise amplifier (LNA) in order to amplify signals picked up by the antenna.

Moreover, the receiver circuit comprises an automatic gain control circuit (AGC) coupled to the at least one amplifier to modify a gain thereof. The AGC is particularly adapted to dynamically modify the gain of the amplifier in order to adapt the sensitivity and/or inter-modulation of the receiver circuit to the respective properties of the signal actually received and provided by the antenna.

Furthermore, the receiver circuit comprises at least one voltage offset-compensating circuit embedded in the automatic gain control circuit. The voltage offset-compensating circuit comprises a clock generator and at least one capacitor to effectively compensate an offset voltage. Preferably, the voltage offset-compensating circuit is operable to compensate and to effectively remove generic and/or inherent offset voltage of at least one component of the automatic gain control circuit. In this way, a potential negative influence of an offset voltage of electronic components of the AGC no longer has a negative impact on the operation of the AGC.

Moreover, since the voltage offset-compensating circuit is operable to effectively remove a negative impact of inevitable voltage offsets of electronic components of the AGC, a larger variety of low-cost electronic components for the automatic gain control may be implemented without substantially affecting the operability of the automatic gain control and/or of the receiver circuit.

In a preferred embodiment, the automatic gain control comprises a comparator, a peak detector and a threshold value generator. The peak detector and the threshold value generator are coupled to the inverting and non-inverting inputs of the comparator, respectively. The output of the comparator is typically coupled to an up/down counter, providing a kind of a memory cell in order to increase or to reduce a control signal for the amplifier in discrete steps. Hence, the output of the up/down counter is coupled to a gain controlling input of the amplifier.

In preferred embodiments, the input of the peak detector is connected or coupled with the output of the amplifier. Hence, the peak detector is arranged downstream of the amplifier. The threshold value generator is typically implemented as a digital-analogue-converter (DAC) which is operable to provide a threshold value or reference value for the signal generated by the peak detector.

The voltage offset-compensating circuit is particularly operable to compensate an offset voltage of the comparator, of the peak detector and/or of the threshold value generator. Generic and inevitable offset voltages of peak detector, comparator and/or of the threshold value generator can be therefore effectively compensated and their negative impact on the operability of the automatic gain control and the receiver circuit in general can be preferably reduced.

In a further preferred embodiment, the threshold value generator and the comparator are coupled with the clock generator of the voltage offset-compensating circuit. In this way, the peak detector, the threshold value generator and the comparator can be switched between a reset mode and an operation mode depending on whether the clock generator provides a lower or an upper clock signal.

By alternately switching the peak detector, the threshold value generator and the comparator between reset and operation modes, the voltage offset behavior of the peak detector, the threshold value generator and the comparator reveals. Accordingly and by means of the at least one capacitor, at least one offset voltage of said components, peak detector, threshold value generator and comparator can be effectively compensated and removed from the AGC circuit.

In a preferred embodiment at least a first capacitor is arranged between the output of the peak detector and an input of the comparator. By means of the first capacitor, an offset voltage of the peak detector can be effectively stored or accumulated when the peak detector is driven in reset mode by the lower clock signal of the clock generator.

When switching the peak detector into operation mode by means of the upper clock signal of the clock generator, the respective output signal of the peak detector will be present at the first capacitor. Since the first capacitor previously accumulated the offset voltage of the peak detector during the preceding reset mode clock interval, the signal of the peak detector can now be compensated by the accumulated offset voltage. In effect, the charge stored in the first capacitor is operable to effectively subtract the offset voltage from the signal of the peak detector.

In a further preferred embodiment a second capacitor is arranged between the output of the threshold value generator and another input of the comparator. Also here, the second capacitor effectively serves to substract the offset voltage of the threshold value generator previously determined during the reset mode clock interval.

In particular, the output of the first capacitor may be coupled and connected to the inverting input of the comparator while the output of the second capacitor is preferably coupled or connected to the non-inverting input of the comparator.

In a further preferred embodiment, at least one of first and/or second capacitors is operable to accumulate or to store an offset voltage of the peak detector and/or of the threshold value generator, respectively, when the peak detector and/or the threshold value generator are driven in reset mode by a lower clock signal of the clock generator.

Since the clock generator is coupled to the peak detector, the threshold value generator and to the comparator, these particular circuits or components can alternately switched and kept in a reset mode. At their output a respective analogue circuit offset may then be present. Switching the peak detector in reset mode the peak detector will output an offset signal which is equivalent to the peak detector voltage when no RF signal is present to the receiver.

Regarding the threshold value generator, the offset value in reset mode will be equivalent to the so called zero level voltage. This voltage does not have to be zero volts. Resetting of the comparator, hence switching the comparator in reset mode the two offset voltages provided by the peak detector and by the threshold value generator, respectively balance the output voltage of the comparator to mid-level.

The first and/or second capacitors are operable to store the offset voltages across the respective capacitors. As soon as the peak detector, the threshold value generator and the comparator are preferably simultaneously switched into operation mode the respective capacitors are operable to subtract the stored offset voltage from the actual measurement conducted during the clocked operation mode. In this way, the output of the comparator is substantially corrected and compensated by the offset voltages.

Therefore and according to another embodiment, the first and/or the second capacitor is operable to subtract the accumulated or stored offset voltage from an output signal of the peak detector and/or of the threshold value generator when the peak detector and/or the threshold value generator are set in operation mode by an upper clock signal of the clock generator.

According to another embodiment, the receiver also comprises a storage module triggered by the clock signal of the clock generator in order to selectively store an output of the comparator. The storage module is typically operable to process the output of the comparator in order to indicate to an up/down counter whether a respective control signal for the amplifier should be increased or decreased according to the comparison conducted by the comparator.

In a preferred embodiment, the storage module comprises a D-type flip-flop circuit which is triggered by a falling edge of the clock signal. In this way, the output of the comparator can be sampled on the falling edge of the clock signal.

According to another embodiment, the voltage offset-compensating circuit comprises at least one stage of a correlated double sampling circuit. In particular, the at least one capacitor and the clock generator are integrated into the automatic gain control circuit in such a way to implement at least one stage of a correlated double sampling circuit in the receiver circuit and/or in the AGC circuit.

By means of the correlated double sampling circuit provided by the two capacitors and the clock generator an undesired offset, namely the offset of the electronic components of the AGC can be effectively removed or compensated. Here, the output of the components of the AGC, namely of the peak detector, the threshold value generator and the comparator is measured twice, once in a known condition, e.g. in reset mode and once in an unknown condition, namely in operation mode.

The values measured from the known configuration, hence in reset mode, are then subtracted from the unknown condition. In this way, a value with a known relation to the physical quantity, hence to the received RF signal can be generated.

In a further preferred embodiment, the comparator comprises a multistage comparator having at least a first and a second stages. Here, first and second stages are coupled with respective first and second offset compensating circuits, respectively. Accordingly, each comparator of the multi-stage comparator will be equipped with first and second capacitors, respectively. In this way, each stage of a multi-stage comparator can be equipped and provided with a separate offset compensating circuit.

In a further aspect, first and second compensating circuits of a multi-stage comparator featuring at least first and second stages are driven by first and second clock generators operable to generate mutually non-overlapping first and second clock signals, respectively. When implemented in a multistage comparator, the voltage offset-compensating circuit must provide non-overlapping clocks in order to separately determine various offsets of the at least two multi-stage comparators and/or of respective peak detectors and/or threshold value generators.

In still another and independent aspect also a method of compensating of said voltage in a receiver circuit is provided. The method comprises the steps of generating of a clock signal by means of a clock generator. In a second step, a peak detector and/or a threshold value generator is driven in reset mode by means of a lower clock signal. Additionally, also the comparator of the AGC circuit of the receiver circuit is driven in reset mode by the lower clock signal in a simultaneous way.

Switching of peak detector, threshold value generator and comparator between reset and operating modes is typically conducted simultaneously. In a proceeding step, an offset voltage of the peak detector and/or of the threshold value generator is determined. Determination of said offset voltages arising in reset mode of peak detector and threshold value generator is typically provided by first and second capacitors connected to the output of peak detector and threshold value generator, respectively.

In a proceeding step, the peak detector, the comparator and/or the threshold value generator are driven in operation mode by an upper clock signal as provided by the clock generator. Since the first and second capacitors serve to store the offset voltages, in the operation mode, the capacitors are operable to subtract the stored offset voltage from an actually measured output value of peak detector and/or threshold value generator, respectively. In this way and according to a final step, the accumulated or stored offset voltage is subtracted from an output signal of the peak detector and/or from an output signal of the threshold value generator.

In particular, the present method is operable by means of the receiver circuit as described above. Therefore, any features, benefits and general properties of the receiver circuit equally apply to the method and vice versa.

BRIEF DESCRIPTION OF THE DRAWINGS

In the following, a preferred embodiment of the invention will be described in a non-limiting and exemplary way by making reference to the drawings, in which.

DETAILED DESCRIPTION OF THE INVENTION

Figure 1:
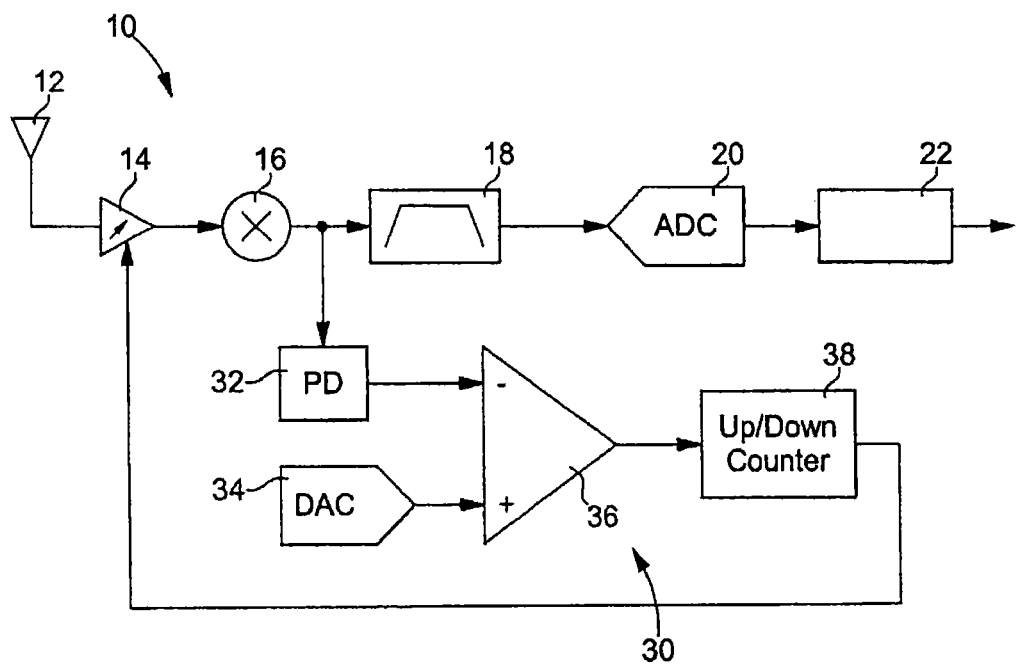
FIG. 1 schematically shows a block diagram of the receiver circuit featuring an automatic gain control circuit.

In FIG. 1 a schematic block diagram of a receiver circuit 10 is presented. The receiver circuit 10 comprises an antenna 12 adapted to receive electromagnetic radiation and to provide respective electrical signals to an input amplifier 14, which is preferably implemented as LNA. The output of the amplifier 14 is coupled with the input of a down-converter mixer 16. Downstream of the mixer 16 there is provided a low-pass or band-pass filter 18 as well as an analogue-to-digital converter (ADC) 20. The output of the ADC 20 is finally provided to a demodulator 22 by way of which the electrical signals received by the antenna 12 can be further processed.

The receiver circuit 10 further comprises an automatic gain control circuit 30. As indicated in FIG. 1, the AGC comprises a comparator 36, a peak detector 32 and a threshold value generator 34, the latter of which being preferably implemented as a DAC. The output of the comparator 36 is connected with an up/down counter 38.

The input of the peak detector 32 is connected with the output of the amplifier 14 and is typically arranged upstream of the mixer 16. The peak detector 32 is therefore integrated into the receiver circuit 10 between the amplifier 14 and the mixer 16.

The output of the peak detector 32 is connected with an input of the comparator 36. Correspondingly, the output of the threshold value generator 34 is connected with another input of the comparator 36. In normal operation mode of the receiver circuit 10, the incoming RF signals provided by the antenna 12 are sensed and detected by the peak detector 32. The signals generable by the peak detector are then compared with a reference or threshold value provided by the threshold value generator 34.

Depending on the magnitude of the output signals of peak detector 32 and threshold value generator 34, the comparator 36 is operable to cause the up/down counter to count up or to count down, thereby decreasing or increasing the gain of the amplifier 14, respectively. As illustrated in more detail in FIG. 2, the automatic gain control circuit 30 further comprises a clock generator 40 which is coupled with the peak detector 32 as well as with the threshold value generator 34. Additionally, the clock generator 40 is directly connected to the comparator 36 as well as to a D-type flip-flop circuit serving as a storage module 46.

Figure 2:
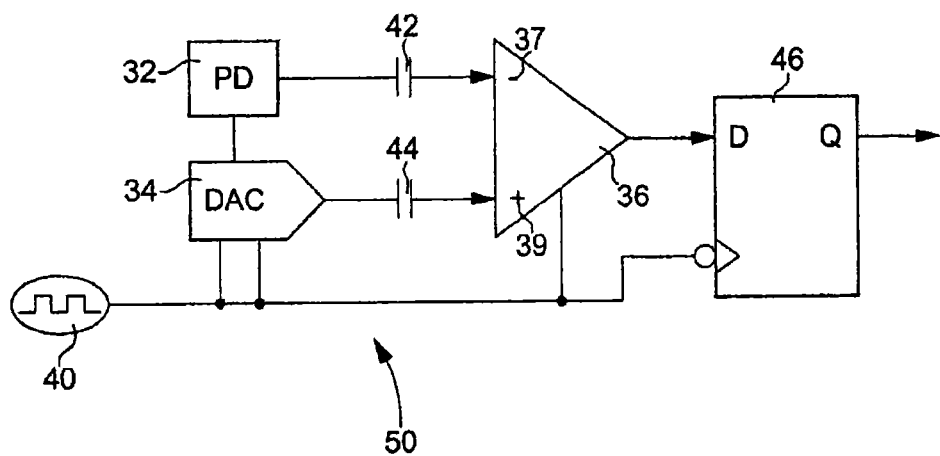
FIG. 2 is illustrative of a schematic block diagram of a voltage offset-compensating circuit implemented in the automatic gain control circuit of the receiver circuit according to FIG. 1.

Additionally, a first capacitor 42 is provided between the peak detector 32 and an input 37 of the comparator 36. Accordingly, a second capacitor 44 is arranged between the output of the threshold value generator 34 and another input 39 of the comparator 36. The automatic gain control circuit 30 as illustrated in FIG. 2 is provided with a voltage offset-compensating circuit 50, which comprises at least the clock generator 40 and the two capacitors 42, 44.

By means of the clock generator 40, the peak detector 32, the threshold value generator 34 and the comparator 36 can be alternately switched between a reset mode and an operation mode. Switching between the two modes occurs substantially simultaneously. In the reset mode, which corresponds to a lower clock signal the peak detector 32 and the threshold value generator 34 are operable to provide an offset voltage at their output. By means of the first and second capacitors 42, 44 coupled with respective outputs, said offset voltage can be effectively stored by the capacitors 42, 44 at least during the lower clock signal interval.

When the clock signal changes to an upper clock, the peak detector 32, the threshold value generator 34 and the comparator 36 are simultaneously switched into an operation mode. In the course of switching into the operation mode, the offset voltages previously stored by first and second capacitors 42, 44 are effectively subtracted from the input signal present at the two inputs 37, 39 of the comparator 36.

In the reset mode also the comparator 36 is effectively calibrated. The input signal present at comparator inputs 37, 39 during the reset configuration are operable to balance the output voltage of the comparator 36 to mid-level. Finally, when driving the voltage offset-compensating circuit 50 and the AGC circuit 30 in operation mode, the output of the comparator 36 will be substantially unaffected of any intrinsic offset voltages inevitably produced by the peak detector 32, the threshold value generator 34 and/or the comparator 36.

The output of the comparator 36 is further connected with the input of a storage module 46, which is typically implemented as a D-type flip-flop circuit. By means of the storage module 46 the output of the comparator 36 can be sampled for instance on the falling edge of the clock signal. The output of the storage module 46 may then be provided to the up/down counter 38.

Even though not explicitly illustrated, the AGC circuit 30 may not only comprise a single comparator 36 but may feature a multiplicity of comparators 36, each of which representing a stage of a multi-stage AGC circuit 30. In a multi-stage comparator design, non-overlapping clock signals must be used in order to selectively determine the offset characteristics of the components of the AGC circuit 30.

What is claimed is:

1. A receiver circuit for processing of electrical signals, and comprising:
   an antenna,
   at least one amplifier coupled to the output of the antenna,
   an automatic gain control circuit coupled to the at least one amplifier to modify a gain thereof, and
   at least one voltage offset-compensating circuit embedded in the automatic gain control circuit and including a clock generator and at least one capacitor to effectively compensate an offset voltage, wherein
   the automatic gain control circuit includes a comparator, a peak detector and a threshold value generator, wherein the peak detector and the threshold value generator are coupled to inverting and non-inverting inputs of the comparator, respectively, and wherein
   at least one of a first capacitor and a second capacitor is operable to accumulate an offset voltage of at least one of the peak detector and the threshold value generator when at least one of the peak detector and the threshold value generator is driven in reset mode by a lower clock signal of the clock generator.

2. The receiver according to claim 1, wherein the peak detector, the threshold value generator and the comparator are coupled with the clock generator.

3. The receiver according to claim 1, wherein the first capacitor is arranged between the output of the peak detector and an input of the comparator.

4. The receiver according to claim 1, wherein the second capacitor is arranged between the output of the threshold value generator and an input of the comparator.

5. The receiver according to claim 1, wherein at least one of the first and the second capacitors is operable to subtract the accumulated offset voltage from an output signal of at least one of the peak detector and the threshold value generator when at least one of the peak detector and the threshold value generator is set in operation mode by an upper clock signal of the clock generator.

6. The receiver according to claim 1, further comprising a storage module triggered by the clock signal of the clock generator to selectively store an output of the comparator.

7. The receiver according to claim 6, wherein the storage module comprises a D-type flip-flop circuit triggered by a falling edge of the clock signal.

8. The receiver according to claim 1, wherein the voltage offset-compensating circuit comprises at least one stage of a correlated double sampling circuit.

9. A method of compensating offset voltage in a receiver circuit according to claim 1, comprising:
   generating of a clock signal by a clock generator,
   driving at least one of a peak detector, a comparator and a threshold value generator in reset mode by a lower clock signal,
   storing or accumulating of an offset voltage of at least one of the peak detector and the threshold value generator,
   driving at least one of the peak detector, the comparator and the threshold value generator in operation mode by an upper clock signal, and
   subtracting the accumulated offset voltage from an output signal of at least one of the peak detector and the threshold value generator when at least one of the peak detector and the threshold value generator is driven in operation mode.

10. A receiver circuit for processing of electrical signals, and comprising:
   an antenna,
   at least one amplifier coupled to the output of the antenna,
   an automatic gain control circuit coupled to the at least one amplifier to modify a gain thereof, and
   at least one voltage offset-compensating circuit embedded in the automatic gain control circuit and including a clock generator and at least one capacitor to effectively compensate an offset voltage, wherein
   the automatic gain control circuit includes a comparator, a peak detector and a threshold value generator, wherein the peak detector and the threshold value generator are coupled to inverting and non-inverting inputs of the comparator, respectively, and wherein
   the comparator includes a multistage comparator, having at least a first and a second stage, wherein the first and second stages are coupled with respective first and second offset compensating circuits, respectively.

11. The receiver according to claim 10, wherein the first and second compensating circuits are driven by first and second clock generators operable to generate mutually non-overlapping first and second clock signals, respectively.

* * * * *

UNITED STATES PATENT AND TRADEMARK OFFICE
CERTIFICATE OF CORRECTION

| | | |
|---|---|---|
| PATENT NO. | : 8,768,277 B1 | Page 1 of 1 |
| APPLICATION NO. | : 13/720279 | |
| DATED | : July 1, 2014 | |
| INVENTOR(S) | : Marc Morin et al. | |

It is certified that error appears in the above-identified patent and that said Letters Patent is hereby corrected as shown below:

On the title page, Item (73), the Assignee's Information is incorrect. Item (73) should read:

--(73)  Assignee:  EM Microelectronic-Marin S.A.,
                   Marin (CH)--

Signed and Sealed this
Twenty-eighth Day of October, 2014

Michelle K. Lee
*Deputy Director of the United States Patent and Trademark Office*